(12) United States Patent  (10) Patent No.: US 7,897,464 B2
Umezaki  (45) Date of Patent: Mar. 1, 2011

(54) METHOD OF MANUFACTURING SEMICONDUCTOR DEVICE

(75) Inventor: Junji Umezaki, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/453,228

(22) Filed: May 4, 2009

(65) Prior Publication Data

US 2009/0280610 A1     Nov. 12, 2009

(30) Foreign Application Priority Data

May 8, 2008  (JP) .............................. 2008-122282

(51) Int. Cl.
  *H01L 21/336*  (2006.01)
(52) U.S. Cl. ............... 438/272; 438/589; 257/E21.419; 257/E21.635; 257/E21.442
(58) Field of Classification Search ................ 438/272, 438/589; 272/E21.635, E21.621, E21.419, 272/E21.428, E21.429, E21.442; 257/E21.635, 257/E21.621, E21.419, E21.428, E21.429, 257/E21.442
See application file for complete search history.

(56) References Cited

U.S. PATENT DOCUMENTS

| 5,728,620 | A | 3/1998 | Park |
| 7,205,208 | B2* | 4/2007 | Kim et al. ................... 438/427 |
| 2007/0093077 | A1* | 4/2007 | Grivna ....................... 438/787 |
| 2008/0096382 | A1* | 4/2008 | Ganitzer et al. ............. 438/643 |

FOREIGN PATENT DOCUMENTS

| JP | 08-293541   | 11/1996 |
| JP | 2001-284588 A | 10/2001 |

* cited by examiner

*Primary Examiner*—Caridad M Everhart
(74) *Attorney, Agent, or Firm*—Foley & Lardner LLP

(57) ABSTRACT

A method of manufacturing a semiconductor device including a buried insulating film formed in a bottom part of a trench and a buried-type gate electrode formed in the trench, the method including selectively forming an insulating film in the bottom part of the trench, forming a resist having an opening in a part that corresponds to a region where a device isolation insulating film is formed on a surface of a semiconductor substrate after forming the insulating film, and oxidizing the surface of the semiconductor substrate in the opening to form the device isolation insulating film.

10 Claims, 5 Drawing Sheets

METHOD OF MANUFACTURING SEMICONDUCTOR DEVICE

BACKGROUND

1. Field of the Invention

The present invention relates to a method of manufacturing a semiconductor device, and more specifically, to a method of manufacturing a semiconductor device including a trench-type gate electrode.

2. Description of Related Art

In a semiconductor device, devices such as transistors are formed on a semiconductor substrate, so as to realize each function using the transistors. One of the transistors includes a power transistor that uses high current. In the power transistor, it is required to decrease a resistance value (on resistance) of the transistor in a conduction state and to use high current amount with low loss. In order to realize this object, a vertical structure which flows a current from a front surface of the substrate to a rear surface of the substrate is employed in the power transistor. One of the structures of the vertical transistor includes a trench gate structure. In the trench gate structure, a gate electrode is embedded in a groove (hereinafter referred to as trench) formed in the front surface of the semiconductor substrate and a channel is formed in a side wall of the trench. The transistor having the trench gate structure flows the current from a source region formed in the substrate surface to a drain region formed in the rear surface of the substrate through this channel.

One example of a semiconductor device having such a trench gate structure is disclosed in Japanese Unexamined Patent Application Publication No. 2001-284588. In the semiconductor device disclosed in Japanese Unexamined Patent Application Publication No. 2001-284588, a buried oxide film which is thicker than a gate oxide film formed in an inner wall of a trench is formed in a bottom part of the trench. Then, a diffusion region is formed that will be a channel region of a transistor using the buried oxide film as a mask by oblique ion implantation. As such, the impurity concentration of the diffusion region formed in the side surface of the trench is made uniform in the depth direction. By forming the channel region having uniform impurity concentration, a variation of a threshold voltage of the transistor is suppressed.

Further, in the semiconductor device, a device isolation region is provided in a substrate surface in order to electrically isolate the adjacent transistors. One example of the semiconductor device including the device isolation region is disclosed in Japanese Unexamined Patent Application Publication No. 8-293541. In the semiconductor device disclosed in Japanese Unexamined Patent Application Publication No. 8-293541, the device isolation region separating the semiconductor substrate into an active region and an inactive region is disclosed. In the semiconductor device disclosed in Japanese Unexamined Patent Application Publication No. 8-293541, an insulating film is buried in a trench, and a device isolation region including a region that is continuous with the trench is formed on the surface of the semiconductor substrate. As a result, according to the semiconductor device disclosed in Japanese Unexamined Patent Application Publication No. 8-293541, the device isolation can be made possible without exposing the active region, thereby improving electrical characteristics of the device.

SUMMARY

The device isolation region is generally formed before forming the buried insulating film or the like in the trench. Further, in order to form the buried insulating film in the bottom part of the trench, the surface of the semiconductor substrate is covered with a thick insulating film after forming the trench, followed by etching until when the buried insulating film of the bottom part of the trench has a desired thickness. At this time, as the etching needs to be performed to the deep position of the trench, the strength of the etching in the process of forming the buried insulating film needs to be high. Accordingly, if the device isolation region is formed before forming the buried insulating film, the device isolation region is etched with high strength in the process of forming the buried insulating film, whereby the device isolation region disappears.

One exemplary aspect of an embodiment of the present invention is a method of manufacturing a semiconductor device including a buried insulating film formed in a bottom part of a trench and a buried-type gate electrode formed in the trench, the method including selectively forming an insulating film in the bottom part of the trench, forming a resist having an opening in a part that corresponds to a region where a device isolation insulating film is formed on a surface of a semiconductor substrate after forming the insulating film, and oxidizing the surface of the semiconductor substrate in the opening to form the device isolation insulating film.

According to the method of manufacturing the semiconductor device of the present invention, the device isolation region is formed after forming the buried insulating film. Accordingly, the device isolation region formed in the substrate surface is not influenced by the etching in the process of forming the buried insulating film.

According to the method of manufacturing the semiconductor device of the present invention, the device isolation region can be formed in the substrate surface with ease in the semiconductor device including the buried insulating film.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 9:
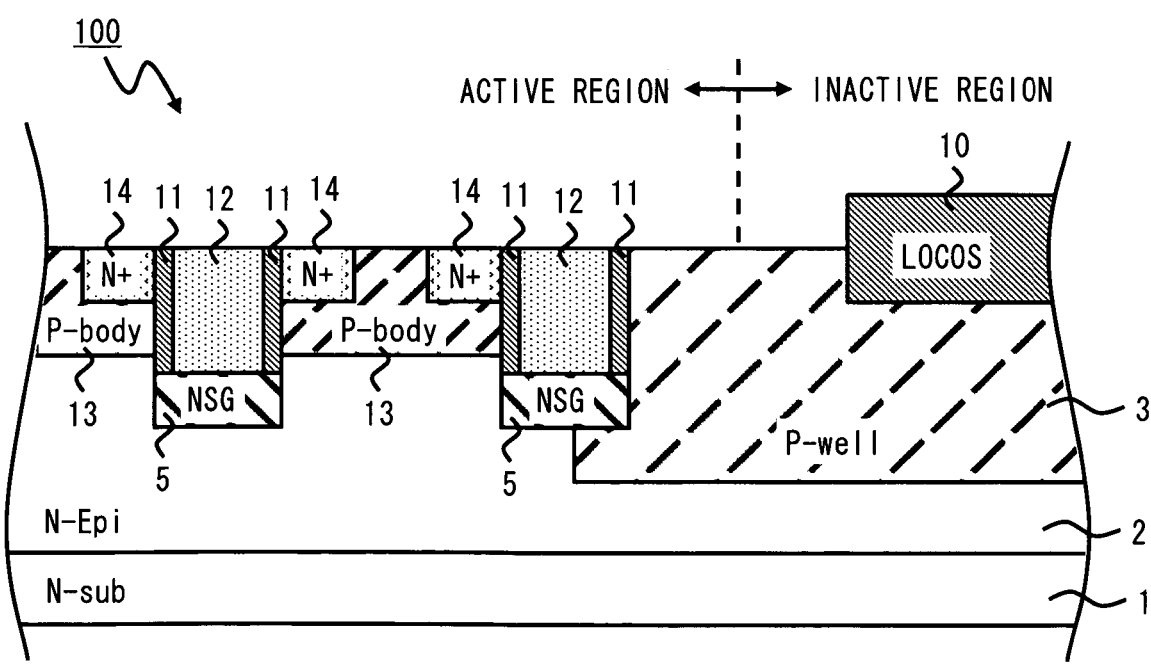
FIG. 9 shows a cross sectional view of the semiconductor device when the processing to step S23 has been completed in the manufacturing method of the semiconductor device according to the first exemplary embodiment.

Hereinafter, the first exemplary embodiment of the present invention will be described with reference to the drawings. FIG. 9 shows a cross sectional view of a semiconductor device 100 according to the first exemplary embodiment. Hereinafter, explanation will be made taking the structure of an N-channel trench-type power transistor as an example. In the example shown in FIG. 9, the semiconductor device 100 includes an active region where a trench-type power transistor is formed, and an inactive region formed along with an outer periphery of the trench-type power transistor.

As shown in FIG. 9, in the semiconductor device 100 according to the first exemplary embodiment, an N-type epitaxial layer (hereinafter referred to as N-Epi layer) 2 is formed in the upper layer of an N-sub layer 1 formed of a semiconductor of one conductive type (N type, for example). Then, on the surface of the N-Epi layer 2, a trench gate region, a body region (region shown as P-body in FIG. 9) 13, and a source region 14 that function as a power transistor are formed. Further, a P-well region 3 is formed in the outer periphery of the transistor formed in the active region. Further, a device isolation region (hereinafter referred to as LOCOS region) 10 is formed in the upper layer of the P-well region 3 in the inactive region.

The trench gate region includes a buried insulating film (region shown as NSG (Non-doped Silicate Glass) in FIG. 9) 5, a gate oxide film 11, and a gate electrode 12. Then, the trench gate region uses the gate oxide film 11 and the buried insulating film 5 as insulating layers and makes the gate electrode 12 function as a gate electrode of the power transistor. The P-body region is a first diffusion region formed of a semiconductor of another conductive type (P type, for example). The P-body region is formed in a region that is adjacent to the trench gate region, and the channel is formed in operating the power transistor. The source region 14 is a region that is adjacent to the trench gate region, and is formed in the upper layer of the P-body region 13. The source region 14 functions as a source of the power transistor. Note that, in the first exemplary embodiment, the N-sub layer 1 is a rear surface of the semiconductor substrate. Then, the N-sub layer 1 functions as a drain of the power transistor.

In the semiconductor device according to the first exemplary embodiment, a buried insulating film 5 which is thicker than the gate oxide film 11 is provided in the bottom part of the trench. Accordingly, it is possible to prevent a depletion layer from being formed around the boundary between the bottom part of the trench and the N-Epi layer 2 when the power transistor is operated. As the depletion layer is prevented from being formed as above, the power transistor according to the first exemplary embodiment is able to decrease the parasitic capacity of the drain.

Figure 1:
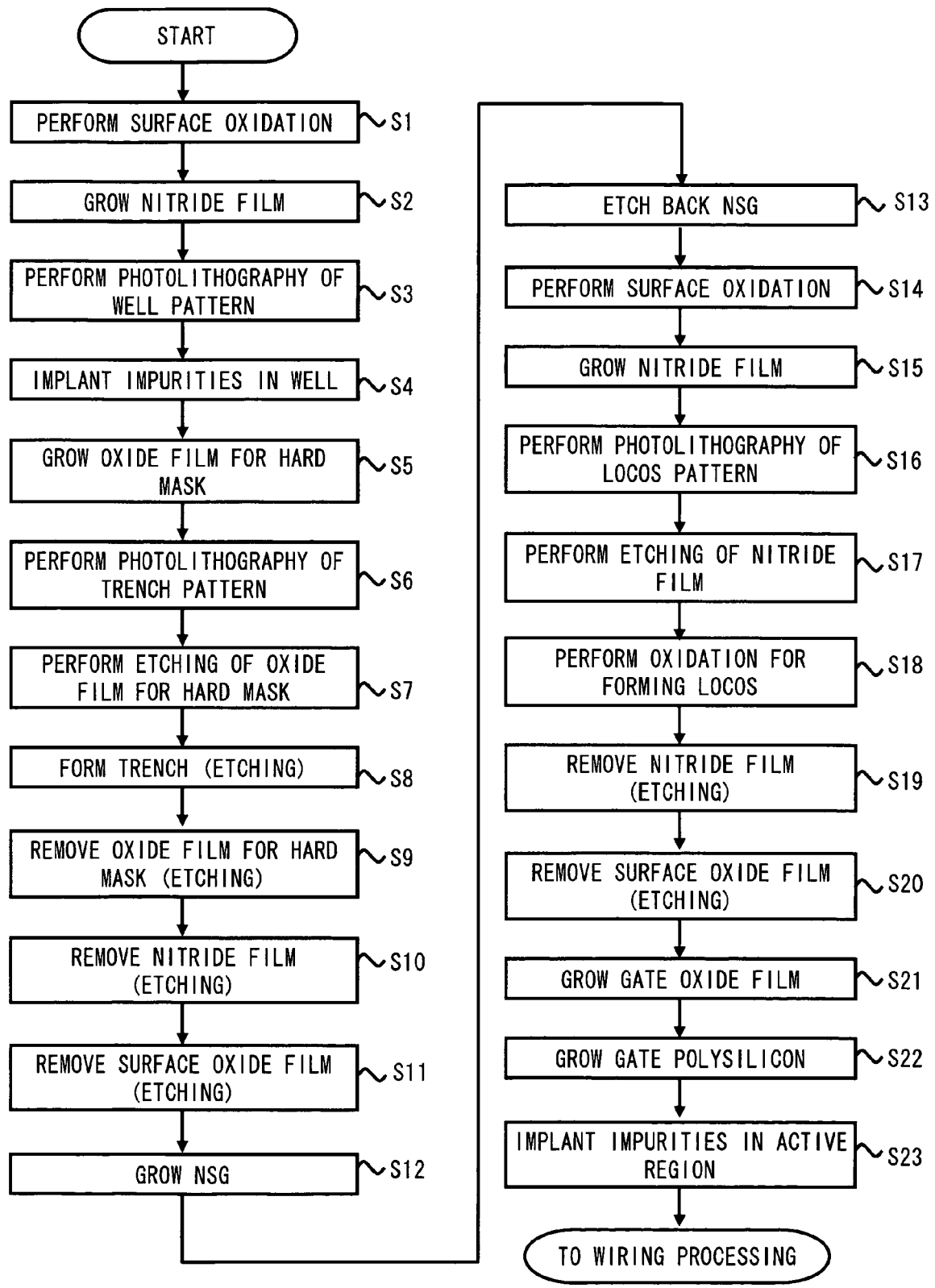
FIG. 1 is a flow chart of a manufacturing method of a semiconductor device according to a first exemplary embodiment.

Now, the manufacturing method of the semiconductor device 100 will be described referring to FIG. 1 showing a flow chart of the manufacturing method of the semiconductor device according to the first exemplary embodiment. The flow chart shown in FIG. 1 starts from a process after the N-Epi layer 2 is epitaxially grown on the upper layer of the N-sub layer 1.

First, in step S1, the surface of the semiconductor substrate is oxidized. Subsequently, in step S2, a CVD nitride film is grown. A surface oxide film that is formed by oxidation in step Si is provided in order to prevent the surface of the semiconductor substrate from being damaged in the process of growing the nitride film in step S2.

Next, in order to form the P-well region 3, a photoresist mask having an opening in a region corresponding to a region where the P-well region 3 is formed is formed by photolithography (step S3). Then, impurities (boron, for example) are ion-implanted into the opening of the photoresist mask formed in step S3 (step S4). In this ion implantation, the boron ions are implanted to transmit the oxide film formed in step S1 and the nitride film formed in step S2. Upon completion of the ion implantation in step S4, the photoresist mask formed in step S3 is removed.

Next, a CVD oxide film (hereinafter referred to as oxide film for hard mask) is grown in the upper layer of the nitride film formed in step S2 by CVD method (step S5). Then, the photoresist mask having an opening in a part corresponding to a region where the trench is formed is formed in the upper layer of the oxide film for hard mask by photolithography (step S6). An opening is provided in the oxide film for hard mask in a part corresponding to the region where the trench is formed using the photomask formed in step S6. The process of forming the opening is performed by dry etching the oxide film for hard mask (step S7).

Then, the trench is formed by etching the silicon substrate (semiconductor substrate) exposed by etching the oxide film for hard mask by anisotropic dry etching (step S8). Note that, in the anisotropic dry etching in step S8, a CF-based gas and an HBr-based gas are employed as an etching gas. Further, in the process of step S8, the oxide film for hard mask is used as the mask. Further, the photoresist in the upper layer of the oxide film for hard mask is removed by a secondary effect of the etching in the etching process in step S8. Then, after the trench is formed in the trench forming process of step S8, the oxide film for hard mask, the nitride film, and the surface oxide film are removed by etching (steps S9 to S11).

Figure 2:
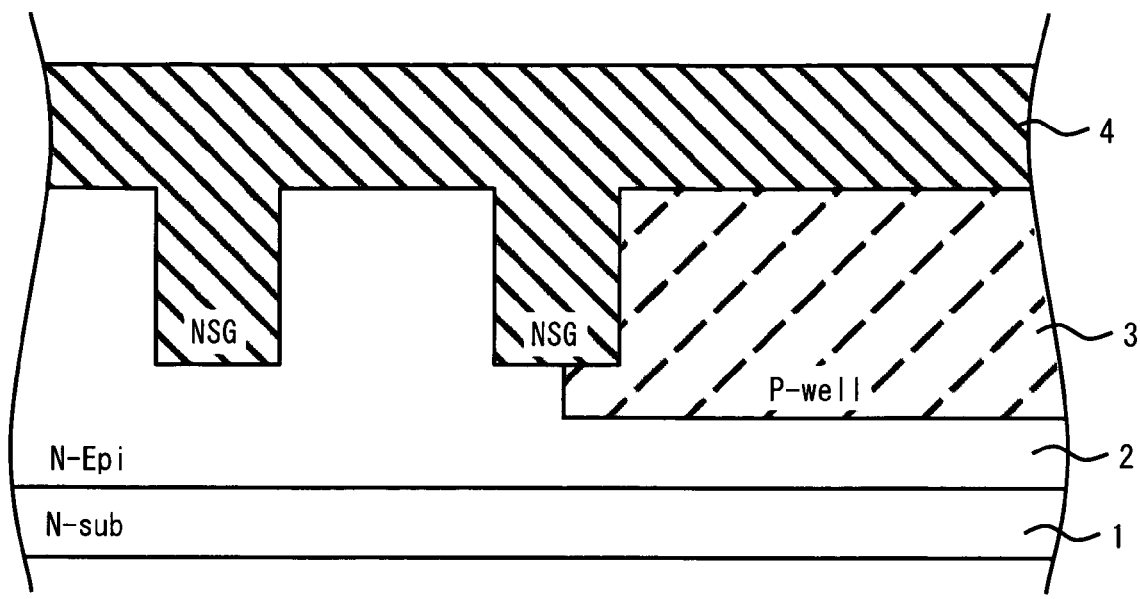
FIG. 2 shows a cross sectional view of the semiconductor device when the processing to step S12 has been completed in the manufacturing method of the semiconductor device according to the first exemplary embodiment.

Subsequently, the insulating film (NSG (Non-doped Silicate Glass) film, for example) is grown on the surface of the semiconductor substrate where the trench is formed in the process to step S11 (step S12). FIG. 2 shows a cross sectional view of the semiconductor device 100 after step S12 is completed. As shown in FIG. 2, in the semiconductor device 100 after completion of step S12, the N-Epi layer 2 is formed in the upper layer of the N-sub layer 1. Further, the P-well region 3 is formed in the upper layer of the N-Epi layer 2 in a part corresponding to the outer periphery of the active region, and the trench is formed in the active region. Then, the NSG film 4 formed on the surface of the semiconductor substrate is formed to fill up the trench.

Figure 3:
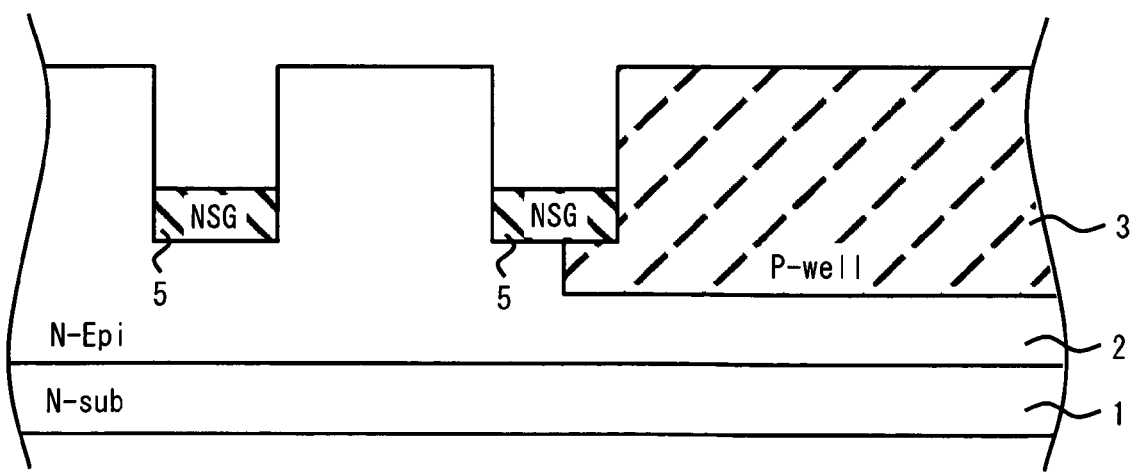
FIG. 3 shows a cross sectional view of the semiconductor device when the processing to step S13 has been completed in the manufacturing method of the semiconductor device according to the first exemplary embodiment.

Next, the NSG film 4 is etched (step. S13). As the etching in this process needs to be performed to the inner part of the trench, this etching is performed with high strength. As such, the NSG film 4 is removed by this etching of high strength. FIG. 3 shows a cross sectional view of the semiconductor device 100 after completion of the process of step S13. As shown in FIG. 3, in the semiconductor device 100 after the etching process in step S13, the NSG film remains in the bottom part of the trench. The NSG film will hereinafter be referred to as buried insulating film 5. The buried insulating film 5 has a film thickness larger than that of the gate insulating film formed in the inner wall of the trench in the later process.

Figure 4:
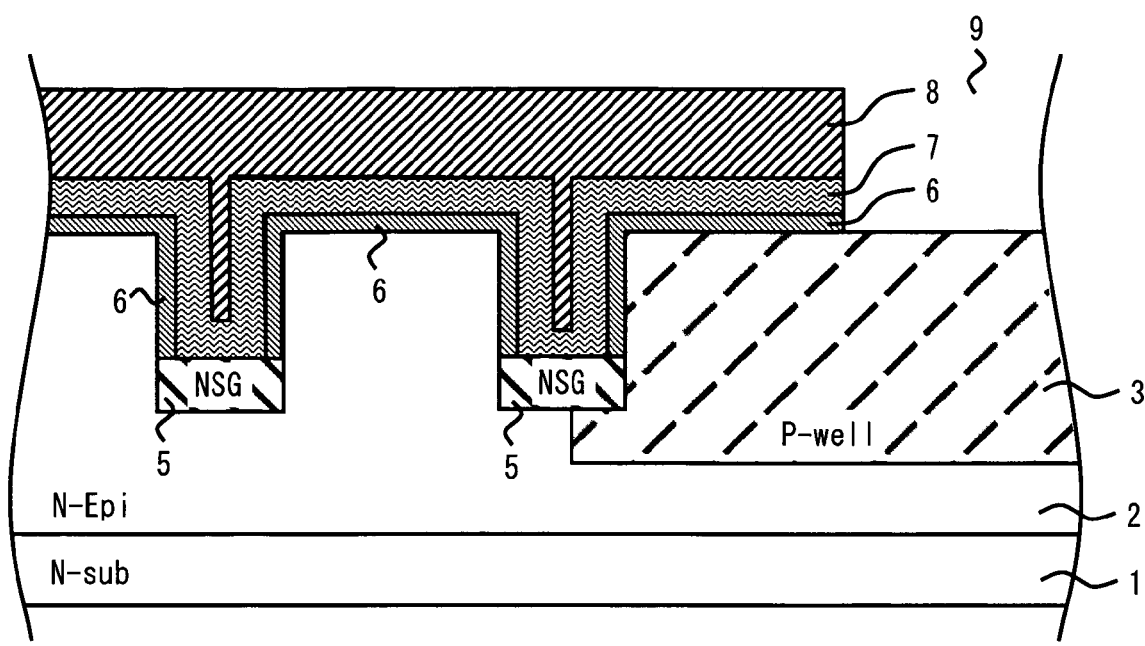
FIG. 4 shows a cross sectional view of the semiconductor device when the processing to step S17 has been completed in the manufacturing method of the semiconductor device according to the first exemplary embodiment.

Next, FIG. 4 shows a cross sectional view of the semiconductor device 100 after completion of the processes of steps S14 to S17. In step S14, the surface of the semiconductor substrate after completion of step S13 is oxidized to form a surface oxide film 6. In step S15, a nitride film 7 is grown in the upper layer of the surface oxide film 6 formed in step S14. Note that the surface oxide film 6 formed in step S14 prevents the surface of the semiconductor substrate from being damaged by the process of growing the nitride film 7 in step S15 as is similar to the surface oxide film formed in step S1.

Next, a photoresist 8 is applied to the upper layer of the nitride film 7. Then, an opening 9 is provided in the photoresist 8 in the part corresponding to the region where the LOCOS is formed by photolithography to form the photoresist mask in accordance with the LOCOS pattern (step S16). Then, the nitride film 7 that is exposed in the opening of the photoresist mask formed in step S16 is removed by etching (step S17). Note that, in the etching process of step S17, the surface oxide film 6 in the part corresponding to the opening of the photoresist 8 is also removed. Accordingly, the semiconductor substrate is exposed in the part of the opening 9 of the photoresist.

Figure 5:
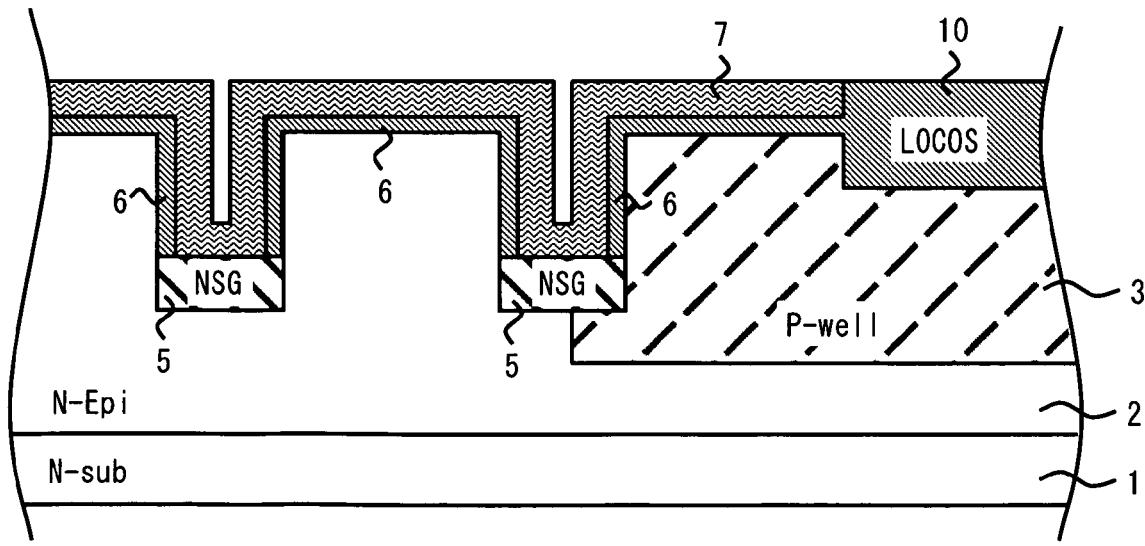
FIG. 5 shows a cross sectional view of the semiconductor device when the processing to step S18 has been completed in the manufacturing method of the semiconductor device according to the first exemplary embodiment.

Now, FIG. 5 shows a cross sectional view of the semiconductor device 100 after completion of the process of step S18. In step S18, the semiconductor substrate which is exposed in step S17 is subjected to oxidation for forming LOCOS. In this oxidation, oxidizing species are implanted into the surface of the semiconductor substrate, followed by heat treatment, so as to form a thick oxide film. This thick oxide film is the LOCOS. Note that, in step S18, the photoresist 8 is removed after forming the LOCOS.

Figure 6:
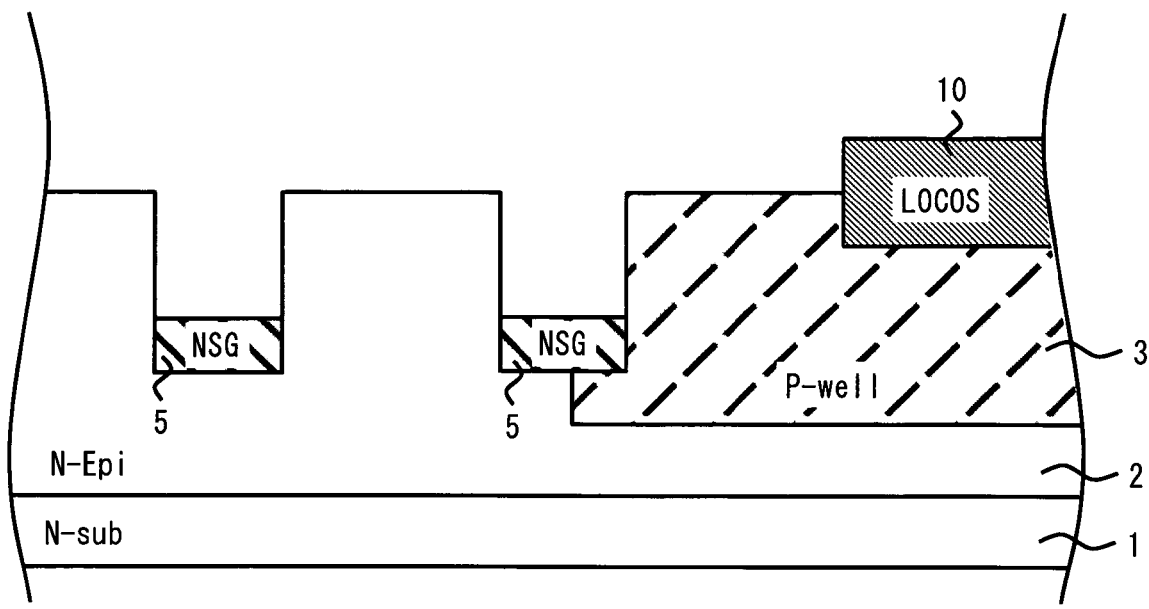
FIG. 6 shows a cross sectional view of the semiconductor device when the processing to step S20 has been completed in the manufacturing method of the semiconductor device according to the first exemplary embodiment.

Now, FIG. 6 shows a cross sectional view of the semiconductor device 100 after completion of the processes of steps S19 and S20. In step S19, the nitride film 7 that is formed in step S15 is removed. Further, in step S20, the surface oxide film formed in step S14 is removed. The removing processing in steps S19 and S20 is performed by etching.

Figure 7:
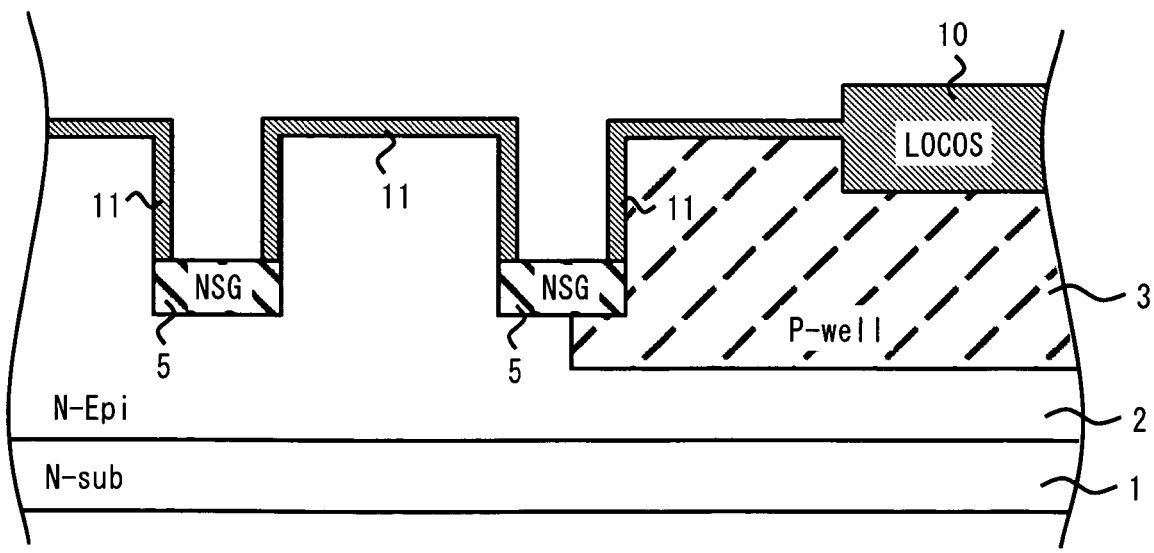
FIG. 7 shows a cross sectional view of the semiconductor device when the processing to step S21 has been completed in the manufacturing method of the semiconductor device according to the first exemplary embodiment.

Next, FIG. 7 shows a cross sectional view of the semiconductor device 100 after completion of the process of step S21. In step S21, the surface of the semiconductor substrate is oxidized to form the oxide film 11. The oxide film 11 formed in the side wall of the trench is the gate oxide film 11.

Figure 8:
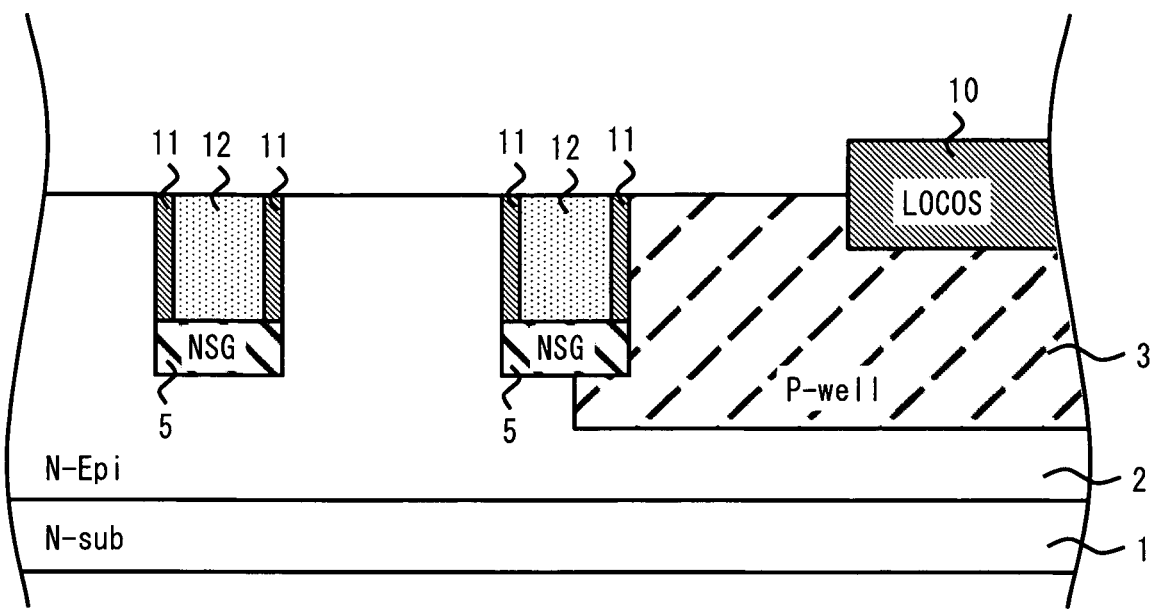
FIG. 8 shows a cross sectional view of the semiconductor device when the processing to step S22 has been completed in the manufacturing method of the semiconductor device according to the first exemplary embodiment.

Next, FIG. 8 shows a cross sectional view of the semiconductor device 100 after completion of the process of step S22. In step S22, the inner part of the trench is filled with the gate electrode material (polysilicon, for example). As such, the gate electrode 12 is formed in the inner part of the trench. Note that, in step S22, the surface of the semiconductor substrate is etched after forming the gate electrode, so as to remove the oxide film formed in the surface of the semiconductor substrate.

Next, FIG. 9 shows a cross sectional view of the semiconductor device 100 after completion of the process of step S23. In step S23, impurities are implanted to form the diffusion layer that will be the body region and the source region of the power transistor. In step S23, impurities (boron, for example) are firstly implanted into the region where the trench is not formed in the active region of the semiconductor substrate by ion implantation. The region into which the boron ions are implanted becomes the P-type semiconductor, and the body region is formed that functions as the channel in operating the power transistor. Subsequently, impurities (phosphorus, for example) are selectively ion-implanted into the region that is adjacent to the trench in the body region. The region into which the phosphorus ions are implanted becomes the N-type semiconductor, and the source region is formed that functions as the source in operating the power transistor.

After that, the wiring processing is performed on the upper layer of the semiconductor substrate formed to step S23, to complete the semiconductor device 100.

As will be understood from the above description, according to the manufacturing method of the semiconductor device 100 of the first exemplary embodiment, the LOCOS is formed after forming the buried insulating film 5 in the bottom part of the trench to have larger thickness than other regions. As such, the LOCOS can be prevented from being influenced by etching processing of high strength after the LOCOS is formed. Accordingly, in the manufacturing method of the semiconductor device 100 according to the first exemplary embodiment, the LOCOS can be manufactured without removing it even with the semiconductor device formed by the etching processing of high strength such as the process of forming the buried insulating film 5.

Further, the surface of the LOCOS generally has a step with respect to the surface of the semiconductor substrate of the active region. Further, the accuracy of the part such as the trench whose region is selectively determined is determined by the dimension of the opening formed in the photoresist by optical processing. Accordingly, when the trench is formed after forming the LOCOS, it is difficult to adjust the focus of an optical processing device due to the step between the surface of the LOCOS and the surface of the semiconductor substrate. If the adjustment of the focus of the optical processing device cannot be performed with high accuracy, the accuracy of dimension of the opening of the photoresist decreases. However, according to the manufacturing method of the semiconductor device 100 according to the first exemplary embodiment, the LOCOS is grown after forming the trench. Thus, the surface of the semiconductor substrate is flat in the process of forming the trench, and the accuracy of the focus of the optical processing device can be improved. Accordingly, the manufacturing method of the semiconductor device 100 according to the first exemplary embodiment is able to improve the accuracy of dimension of the opening of the photoresist, and to improve the accuracy of dimension of the trench or the like.

Further, as the LOCOS is formed around the power transistor formed in the active region in the semiconductor device 100 according to the first exemplary embodiment, a device that is different from the power transistor may be formed on the same semiconductor substrate. Accordingly, it is possible to form a control circuit or the like of the power transistor, for example, in the region that contacts with the inactive region in the region that is not shown in FIG. 9. As such, by forming the power transistor and the control circuit of the power transistor on the same substrate, the semiconductor device having higher performance can be manufactured.

Note that the present invention is not limited to the above exemplary embodiment, but can be changed as appropriate without departing from the scope of the present invention. For example, the semiconductor substrate is not limited to the N-type semiconductor substrate, but the P-type semiconductor substrate may also be used depending on its application. Further, the transistor formed on the semiconductor substrate may be the P channel transistor by changing the impurities to be implanted.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A method of manufacturing a semiconductor device including a buried insulating film formed in a bottom part of a trench and a buried-type gate electrode formed in the trench, the method comprising:
    selectively forming an insulating film in the bottom part of the trench such that a side wall of the trench is not covered by the insulating film;
    forming a mask having an opening in a part that corresponds to a region where a device isolation insulating film is formed on a surface of a semiconductor substrate after forming the insulating film, the mask including an oxide film and a nitride film; and
    oxidizing the surface of the semiconductor substrate in the opening to form the device isolation insulating film,
    wherein the step of oxidizing the surface of the semiconductor substrate in the opening to form the device isolation insulating film is performed after the step of selectively forming the insulating film in the bottom part of the trench.

2. The method of manufacturing the semiconductor device according to claim 1, further comprising:
    forming a gate oxide film having a film thickness smaller than that of the buried insulating film over the side wall of the trench after forming the device isolation insulating film; and
    burying a gate electrode material in the trench after forming the gate oxide film.

3. The method of manufacturing the semiconductor device according to claim 1, further comprising:
    forming a first diffusion region that functions as a body region of a transistor in a region that is adjacent to the trench; and
    forming a second diffusion region that functions as a source region of the transistor in a region that is adjacent to the trench in the upper layer of the first diffusion region.

4. The method of manufacturing the semiconductor device according to claim 1, wherein the device isolation insulating film is formed along with an outer periphery of an active region that functions as a transistor in the semiconductor substrate.

5. The method of manufacturing the semiconductor device according to claim 1, wherein a transistor formed in the semiconductor device is a vertical field effect transistor having a gate electrode formed in the trench, a source region in a front surface side of the semiconductor substrate, and a drain region in a rear surface side of the semiconductor substrate.

6. A method of manufacturing a semiconductor device including a buried insulating film formed in a bottom part of a trench and a buried-type gate electrode formed in the trench, the method comprising:
    selectively forming an insulating film in the bottom part of the trench such that a side wall is not covered by the insulating film;
    forming an oxide film after the selectively forming an insulating film;
    forming a nitride film after the forming a oxide film;
    forming an opening in the nitride film and the oxide film in a part that corresponds to a region where a device isolation insulating film is formed on a surface of a semiconductor substrate; and
    oxidizing the surface of the semiconductor substrate in the opening to form the device isolation insulating film,
    wherein the step of oxidizing the surface of the semiconductor substrate in the opening to form the device isolation insulating film is performed after the step of selectively forming the insulating film.

7. The method of manufacturing the semiconductor device according to claim 6, further comprising:
    forming a gate oxide film having a film thickness smaller than that of the buried insulating film over the side wall of the trench after forming the device isolation insulating film; and
    burying a gate electrode material in the trench after forming the gate oxide film.

8. The method of manufacturing the semiconductor device according to claim 6, further comprising:
    forming a first diffusion region that functions as a body region of a transistor in a region that is adjacent to the trench; and
    forming a second diffusion region that functions as a source region of the transistor in a region that is adjacent to the trench in the upper layer of the first diffusion region.

9. The method of manufacturing the semiconductor device according to claim 6, wherein the device isolation insulating film is formed along with an outer periphery of an active region that functions as a transistor in the semiconductor substrate.

10. The method of manufacturing the semiconductor device according to claim 6, wherein a transistor formed in the semiconductor device is a vertical field effect transistor having a gate electrode formed in the trench, a source region in a front surface side of the semiconductor substrate, and a drain region in a rear surface side of the semiconductor substrate.

* * * * *